(12) United States Patent
Yin et al.

(10) Patent No.: US 11,637,203 B2
(45) Date of Patent: Apr. 25, 2023

(54) SEMICONDUCTOR DEVICE AND MANUFACTURING METHOD OF THE SAME

(71) Applicant: Taiwan Semiconductor Manufacturing Company, Ltd., Hsinchu (TW)

(72) Inventors: Yu-Feng Yin, Hsinchu County (TW); Chia-Jung Yu, Hsinchu (TW); Pin-Cheng Hsu, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/383,423

(22) Filed: Jul. 22, 2021

(65) Prior Publication Data

US 2023/0024174 A1 Jan. 26, 2023

(51) Int. Cl.
| | |
|---|---|
| *H01L 29/78* | (2006.01) |
| *H01L 29/51* | (2006.01) |
| *H01L 29/66* | (2006.01) |
| *H01L 29/10* | (2006.01) |
| *H01L 29/08* | (2006.01) |

(52) U.S. Cl.
CPC .... *H01L 29/78391* (2014.09); *H01L 29/0847* (2013.01); *H01L 29/1033* (2013.01); *H01L 29/516* (2013.01); *H01L 29/6656* (2013.01); *H01L 29/6684* (2013.01)

(58) Field of Classification Search
CPC ........... H01L 29/78391; H01L 29/0847; H01L 29/1033; H01L 29/516; H01L 29/6656; H01L 29/6684
See application file for complete search history.

(56) References Cited

U.S. PATENT DOCUMENTS

| | | | |
|---|---|---|---|
| 2020/0027883 A1* | 1/2020 | Le | ...................... H01L 27/10873 |
| 2020/0098887 A1* | 3/2020 | Dewey | .................... H01L 29/51 |
| 2021/0083122 A1* | 3/2021 | Naylor | .............. H01L 27/11597 |

* cited by examiner

*Primary Examiner* — Julia Slutsker
(74) *Attorney, Agent, or Firm* — JCIPRNET

(57) ABSTRACT

A semiconductor device includes a transistor. The transistor includes a gate electrode, a channel layer, a gate dielectric layer, a first source/drain region and a second source/drain region and a first spacer. The channel layer is disposed on the gate electrode. The gate dielectric layer is located between the channel layer and the gate electrode. The first source/drain region and the second source/drain region are disposed on the channel layer at opposite sides of the gate electrode, and at least one of the first and second source/drain regions includes a first portion and a second portion between the first portion and the gate electrode. The first spacer is disposed on the channel layer. The first spacer is disposed on a first sidewall of the second portion of the at least one of the first and second source/drain regions, and the first portion is disposed on the first spacer.

20 Claims, 13 Drawing Sheets

SEMICONDUCTOR DEVICE AND MANUFACTURING METHOD OF THE SAME

BACKGROUND

The integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
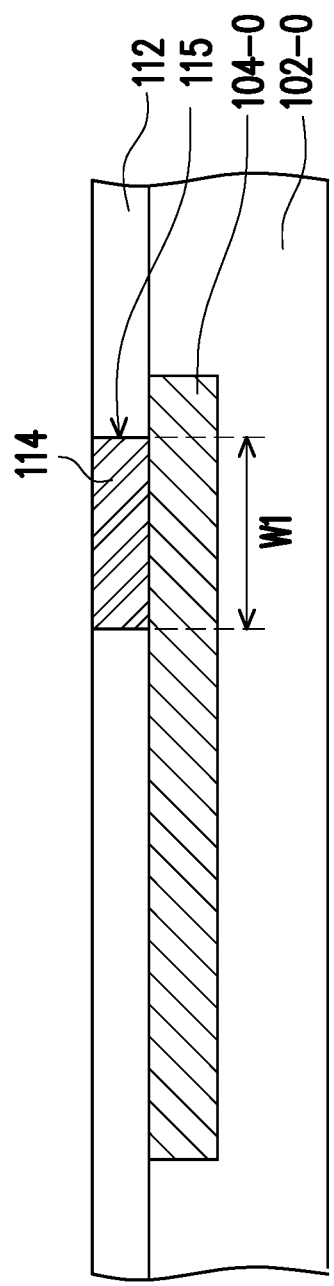
FIG. 1A to FIG. 1G are schematic cross-sectional views illustrating various stages of a manufacturing method of a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are schematic cross-sectional views illustrating various stages of a manufacturing method of a semiconductor device.

Referring to FIGS. 1A to 1E, a transistor T is formed. First, as shown in FIG. 1A, a gate electrode 114 is formed. In some embodiments, the gate electrode 114 is formed on a dielectric layer 102-0 to electrically connect to a conductive feature 104-0. The dielectric layer 102-0 and the conductive feature 104-0 may be parts of an interconnect structure 110 (as shown in FIG. 1G). Thus, the dielectric layer 102-0 is alternatively referred to as an Inter-Metal Dielectric (IMD) layer, for example. In some embodiments, the dielectric layer 102-0 is formed of a low-k dielectric material having a dielectric constant (k-value) lower than about 3.0, about 2.5, or even lower. In some embodiments, the dielectric layer 102-0 is formed of non-low-k dielectric materials such as silicon oxide, silicon carbide (SiC), silicon carbo-nitride (SiCN), silicon oxy-carbo-nitride (SiOCN), or the like. In some alternative embodiments, a material of the dielectric layer 102-0 includes polyimide, epoxy resin, acrylic resin, phenol resin, benzocyclobutene (BCB), polybenzooxazole (PBO), or any other suitable polymer-based dielectric material. The dielectric layer 102-0 may be formed by suitable fabrication techniques such as spin-on coating, chemical vapor deposition (CVD), plasma-enhanced chemical vapor deposition (PECVD), or the like. However, the disclosure is not limited thereto. In some alternative embodiments, the gate electrode 114 is formed over any suitable dielectric layer or substrate and electrically connected to any other suitable conductive feature or device.

In some embodiments, the conductive feature 104-0 is a conductive line. The conductive feature 104-0 is formed in the dielectric layer 102-0. The conductive feature 104-0 may be formed by electroplating, deposition, and/or photolithography and etching. The conductive feature 104-0 may be formed by a single damascene process. For example, a trench is first formed in the dielectric layer 102-0, followed by filling the trench with a conductive material. A planarization process such as a CMP process is then performed to remove the excess portions of the conductive material higher than the top surface of the dielectric layer 102-0, leaving a conductive line in the trench. The conductive material may include a diffusion barrier layer and a metallic material over the diffusion barrier layer. The diffusion barrier layer may include titanium, titanium nitride, tantalum, tantalum nitride, or the like, and the metallic material may include copper, silver, gold, tungsten, aluminum, combinations thereof, or the like.

In some embodiments, a gate electrode 114 is formed in a dielectric layer 112 on the dielectric layer 102-0. Similar to the dielectric layer 102-0, the dielectric layer 112 may be alternatively referred to as an IMD layer. In some embodiments, the material and the formation method of the dielectric layer 112 are similar to those of the dielectric layer 102-0, so the detailed description thereof is omitted herein. In some embodiments, the gate electrode 114 is formed by a single damascene process. For example, a trench is first formed in the dielectric layer 112, followed by filling the trench with a metallic material. A planarization process such as a CMP process is then performed to remove the excess portions of the metallic material higher than the top surface of the dielectric layer 112, leaving the gate electrode 114 in the trench. In some alternative embodiments, the gate electrode 114 is formed by deposition and/or photolithography and etching process. In some embodiments, the metallic material is conformally deposited on the dielectric layer 102-0 through atomic layer deposition (ALD), CVD, physical vapor deposition (PVD), or the like. Thereafter, a patterned photoresist layer (not shown) is formed on the metallic material to define the shape of the subsequently formed gate electrode 114. Subsequently, an etching process is performed to remove the metallic material that is not covered by the patterned photoresist layer. The etching process includes, for example, an anisotropic etching process such as dry etch or an isotropic etching process such as wet etch. Then, the patterned photoresist layer is removed through a stripping process or the like to expose the remaining metallic material, which constitutes the gate electrode 114.

In some embodiments, the metallic material of the gate electrode 114 includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the gate electrode 114 also includes materials to fine-tune the corresponding work function. For example, the metallic material of the gate electrode 114 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof.

In some embodiments, a barrier layer (not shown) is optionally formed between the gate electrode 114 and the conductive feature 104-0, so as to avoid diffusion of atoms between elements. In some embodiments, a material of the barrier layer includes titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof.

In some embodiments, a thickness of the gate electrode 114 ranges from about 30 Å to about 250 Å. In some embodiments, a width W1 of the gate electrode 114 ranges from about 50 nm to about 1 μm. The width of the gate electrode 114 may be substantially the same as a distance between opposite sidewalls 115 of the gate electrode 114.

Figure 1B:
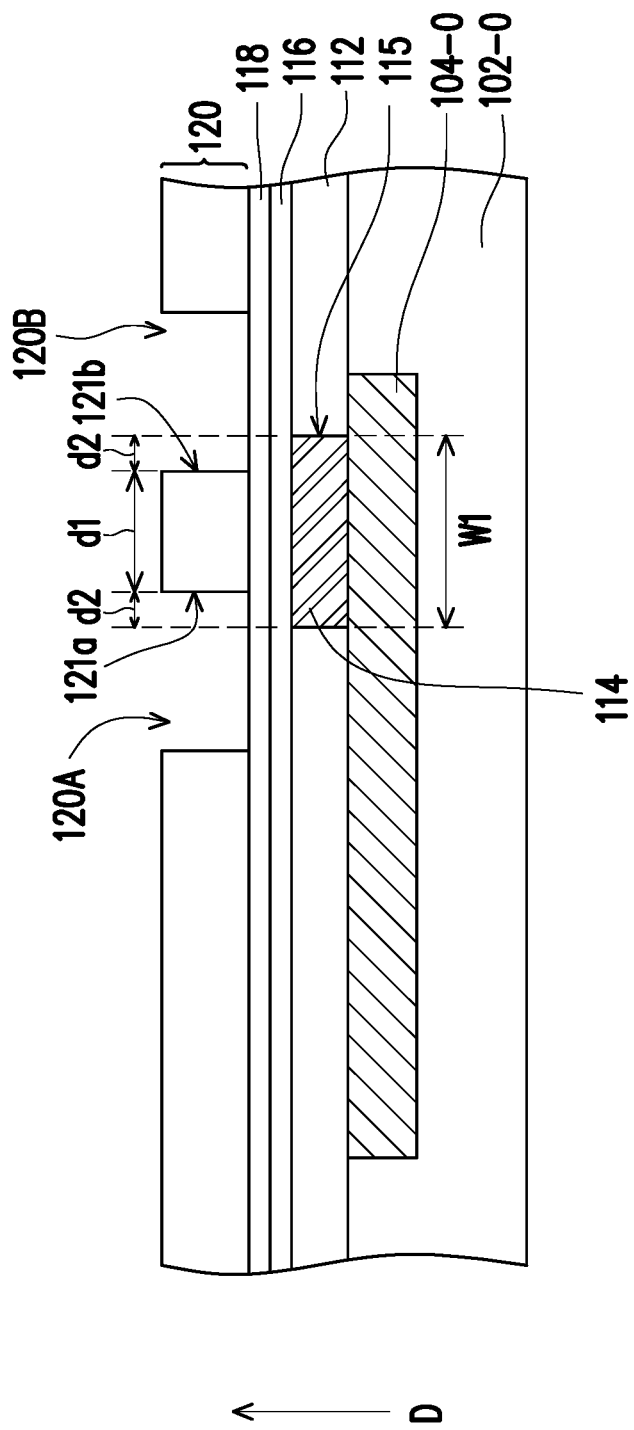

Referring to FIG. 1B, a gate dielectric layer 116 is formed on the gate electrode 114, and a channel layer 118 is formed on the gate dielectric layer 116. In some embodiments, the gate dielectric layer 116 has a thickness ranging from about 50 Å to about 150 Å. In some embodiments, the gate dielectric layer 116 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the gate dielectric layer 116 has a dielectric constant ranging from 20 to 50. In some embodiments, the gate dielectric layer 116 includes metal oxides, metal nitrides, metal silicates, transition metal-oxides, transition metal-nitrides, transition metal-silicates, oxynitrides of metals, metal aluminates, or combinations thereof. For example, the gate dielectric layer 116 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The foregoing materials may be deposited by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. However, the disclosure is not limited thereto. In some embodiments, the gate dielectric layer 116 is a ferroelectric layer and includes $HfO_2$ doped with Si, $Al_2O_5$, $HfZrO_x$, Ce, La, ZrO, $Pb_3Ge_5O_1$ (PGO), lead zirconate titanate (PZT), $SrBi_2Ta_2O_9$ (SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, hafnium silicate, HfAlO, LaAlO, lanthanum oxide, $HfO_2$ doped with Si, $a_2O_5$, $HfZrO_x$, or a combination thereof.

In some embodiments, the channel layer 118 has a thickness ranging from about 20 Å to about 100 Å. In some embodiments, the channel layer 118 includes oxide semiconductor material such as IZO, IGZO, ZnO, InO, GaO, the like, or a combination thereof. In some embodiments, the channel layer 118 is made of a single layer having one of the foregoing materials. For example, the channel layer 118 includes IGZO. However, the disclosure is not limited thereto. In some alternative embodiments, the channel layer 118 may be made of a laminate structure of at least two of the foregoing materials. In some alternative embodiments, the channel layer 118 is doped with a dopant to achieve extra stability. For example, the channel layer 118 may be doped with silicon dopant or the like. In some embodiments, the channel layer 118 is deposited by suitable techniques, such as CVD, ALD, PVD, PECVD, epitaxial growth, or the like.

Then, a dielectric layer 120 is formed on the channel layer 118. Similar to the dielectric layer 102-0, the dielectric layer 120 may be alternatively referred to as an IMD layer. In some embodiments, the material and the formation method of the dielectric layer 120 are similar to those of the dielectric layer 102-0, so the detailed description thereof is omitted herein. In some embodiments, the dielectric layer 120 includes a plurality of openings 120A, 120B. The openings 120A, 120B may be formed by photolithography and etching. The openings 120A, 120B are formed at opposite sides (i.e., opposite sidewalls 115) of the gate electrode 114, and thus the openings 120A, 120B expose the channel layer 118 on the opposite sides of the gate electrode 114. In some embodiments, the openings 120A, 120B are partially overlapped with the gate electrode 114 thereneath. For example, in a direction D (e.g., a vertical direction), a sidewall 121b of the opening 120B is directly on or overlapped with the gate electrode 114. The direction D is also referred to as a stacking direction of the gate electrode 114, the channel layer 118 and the dielectric layer 120, for example. In such embodiments, a distance d1 between the sidewall 121a of the opening 120A and the sidewall 121b of the opening 120B is smaller than the width W1 of the gate electrode 114. In some embodiments, a distance d2 between the sidewall 121a, 120b of the opening 120A, 120B and the sidewall 115 of the gate electrode 114 is equal to or smaller than 50 nm. In some embodiments, the distance d2 between the sidewall 121a of the opening 120A and the sidewall 115 of the gate electrode 114 is substantially equal to the distance d2 between the sidewall 121b of the opening 120B and the sidewall 115 of the gate electrode 114. However, the disclosure is not limited thereto. In some alternative embodiments, the distance d2 between the sidewall 121a of the opening 120A and the sidewall 115 of the gate electrode 114 is different from the distance d2 between the sidewall 121b of the opening 120B and the sidewall 115 of the gate electrode 114. In some alternative embodiments, the openings 120A, 120B are not overlapped with the gate electrode 114 therebeneath. In such embodiments, the distance d1 between the sidewall 121a of the opening 120A and the sidewall 121b of the opening 120B is substantially equal to or larger than the width W1 of the gate electrode 114.

Figure 1C:
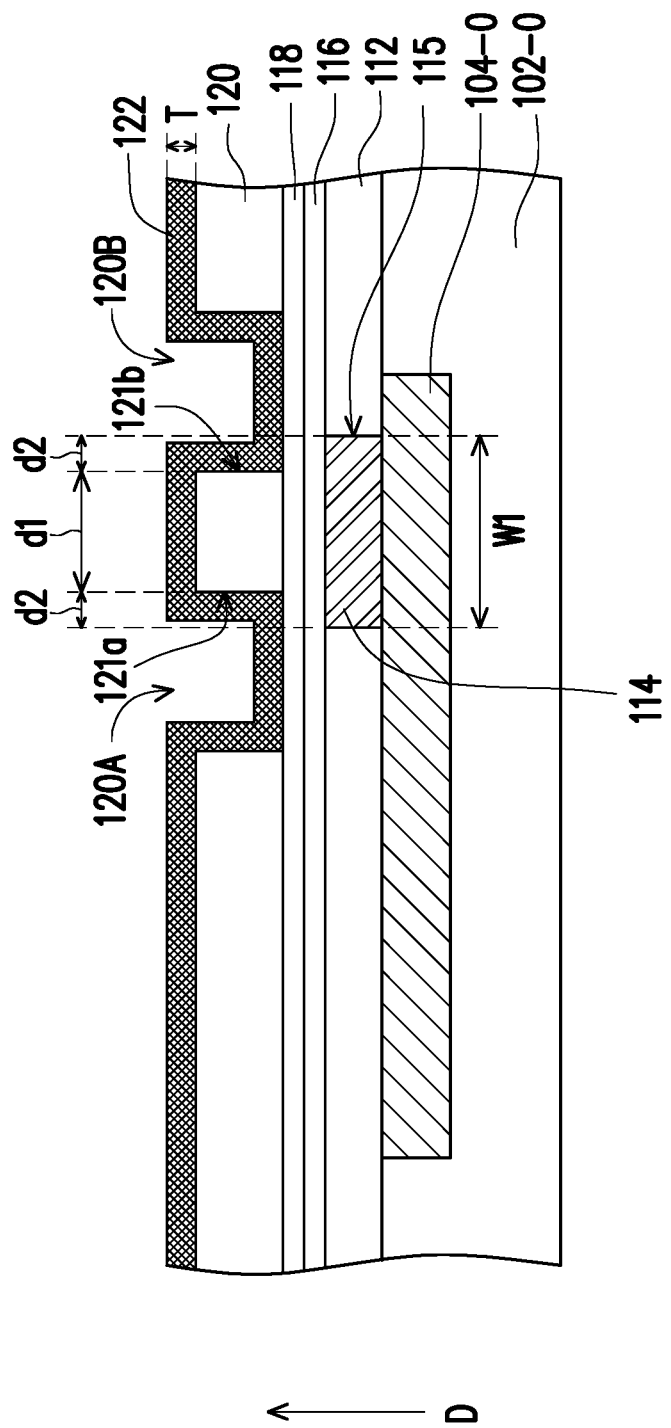

Referring to FIG. 1C, a spacer layer 122 is formed on exposed surfaces of the openings 120A, 120B over the channel layer 118. In some embodiments, the spacer layer 122 has a thickness T ranging from about 10 Å to about 500 Å. In some embodiments, the spacer layer 122 includes silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the dielectric constant of the spacer layer 122 is larger than the dielectric constant of an IMD layer such as the dielectric layer 120. In some embodiments, the water absorption capacity (i.e., moisture absorption capacity) of the spacer layer 122 is higher than the water absorption capacity (i.e., moisture absorption capacity) of an IMD layer such as the dielectric layer 120. The material of the spacer layer 122 may be the same as or different from the material of the gate dielectric layer 116. The material of the dielectric pattern 120 may be the same as or different from the material of the channel layer 118. In some embodiments, the spacer layer 122 includes metal oxides, metal nitrides, metal silicates, transition metal-oxides, transition metal-nitrides, transition metal-silicates, oxynitrides of metals, metal aluminates, or combinations thereof. For example, the spacer layer 122 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), gallium oxide (GaO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The foregoing materials may be deposited by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. However, the disclosure is not limited thereto.

Figure 1D:
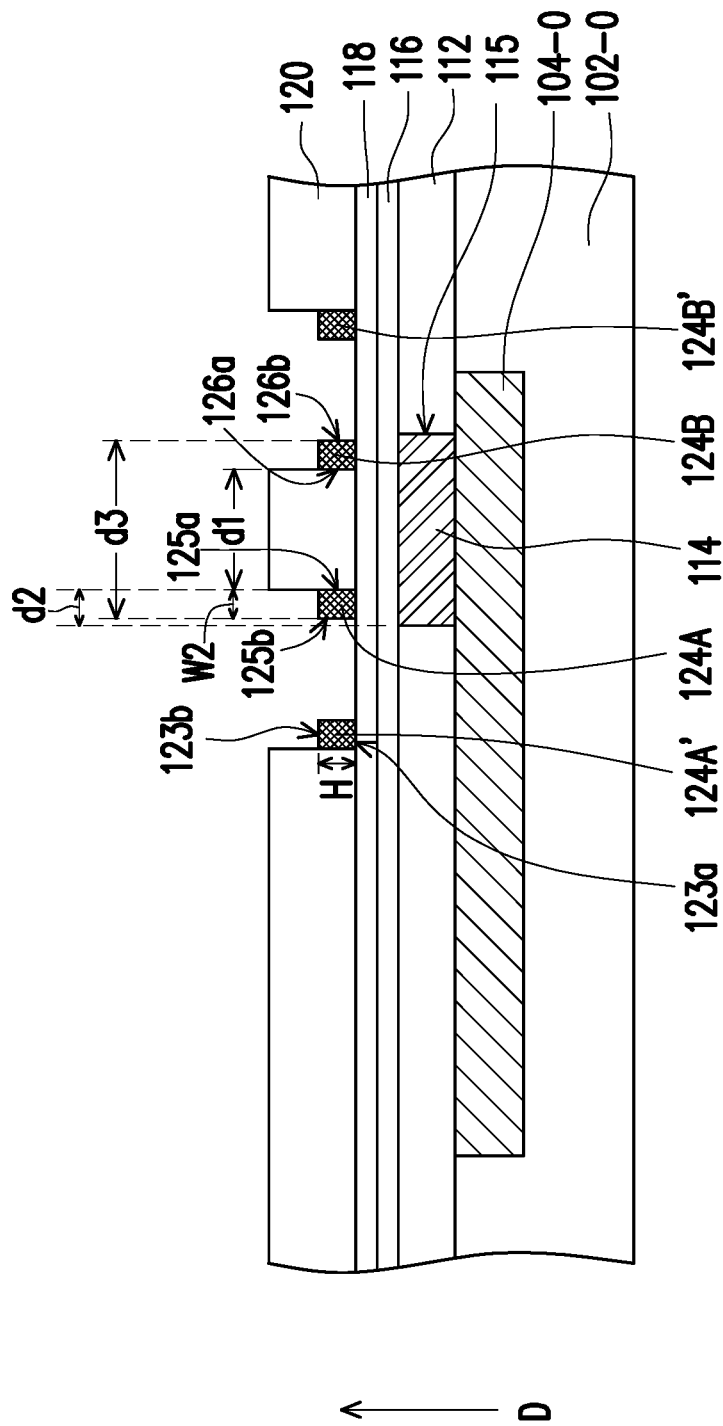

Referring to FIG. 1D, the spacer layer 122 is partially removed, to form pairs of spacers 124A, 124A', 124B, 124B' in the openings 120A, 120B respectively. In some embodiments, the pair of spacers 124A, 124A' is self-aligned formed in the opening 120A, and the pair of spacers 124B, 124B' is self-aligned formed in the opening 120B. The pair of spacers 124A, 124A' is formed on opposite sidewalls 121a of the opening 120A, and the pair of spacers 124B, 124B' is formed on opposite sidewalls 121b of the opening 120B. The spacer layer 122 is partially removed by an anisotropic etching process without masking the spacer layer 122, for example. In such embodiments, an etching rate (e.g., vertical etching rate) of the spacer layer 122 on upper surfaces of the dielectric layer 120 and bottom surfaces of the openings 120A, 120B is significantly higher than an etching rate (e.g., horizontal etching rate) of the spacer layer 122 on the sidewalls 121a, 121b of the openings 120A, 120B. Thus, after performing the anisotropic etching process, the spacer layer 122 on the sidewalls 121b of the openings 120A, 120B may be remained as the spacers 124A, 124A', 124B, 124B'. The spacers 124A, 124A', 124B, 124B' have a surface 123a facing the gate electrode 114 and a surface 123b opposite to the surface 123a. The surface 123a is a bottom surface, and the surface 123b is a top surface, for example. The height H of the spacers 124A, 124A', 124B, 124B' is measured between the opposite surfaces 123a, 123b and is smaller than a height of the openings 120A, 120B, for example. In some embodiments, the height H of the spacers 124A, 124A', 124B, 124B' ranges from about 50 Å to about 200 Å. In some embodiments, the width W2 of the spacers 124A, 124A', 124B, 124B' ranges from about 5 Å to about 200 Å. The height H of the spacers 124A, 124A', 124B, 124B' may be the same or different, and the width W2 of the spacers 124A, 124A', 124B, 124B' may be the same or different. In other words, although FIG. 1D illustrates the pair of the spacers 124A, 124A' is the same as the pair of the spacers 124B, 124B', the spacer 124A is the same as the spacer 124A' and the spacer 124B is the same as the spacer 124B', the disclosure is not limited thereto. The spacers 124A, 124A', 124B, 124B' may be different from one another in shape, width, height, materials and so on. In some alternative embodiments, the spacers 124A, 124A', 124B, 124B' are formed separately.

In some embodiments, in the direction D, a sidewall 121b of the opening 120B at least one of the pair of the spacers 124A, 124A' is overlapped with the gate electrode 114, and similarly, at least one of the pair of the spacers 124A, 124A' is overlapped with the gate electrode 114. For example, the spacer 124A (also referred to as inner spacer 124A) of the pair of the spacers 124A, 124A' is overlapped with the gate electrode 114, and the spacer 124B (also referred to as inner spacer 124A) of the pair of the spacers 124B, 124B' is overlapped with the gate electrode 114. In some embodiments, the spacer 124A, 124B is entirely overlapped with the gate electrode 114. For example, both sidewalls 125a and 125b of the spacer 124A are directly on or overlapped with the gate electrode 114, and both sidewalls 126a and 126b of the spacer 124B are directly on or overlapped with the gate electrode 114. In such embodiments, the distance d1 between the sidewall 125a of the spacer 124A and the sidewall 126a of the spacer 124B is smaller than the width W1 of the gate electrode 114, and a distance d3 between the sidewall 125b of the spacer 124A' and the sidewall 126b of the spacer 124B' is smaller than or the same as the width W1 of the gate electrode 114. In some embodiments, the distance d1 is equal to or smaller than 50 nm. In some embodiments, as shown in FIG. 1D, the distance d3 between the sidewall 125b of the spacer 124A, 124A' and the sidewall 126b of the spacer 124B, 124B' is smaller than the width W1 of the gate electrode 114. The sidewalls 125a, 125b, 126a, 126b of the spacers 124A, 124B may be disposed between opposite sidewalls 115 of the gate electrode 114. In some embodiments, the sidewall 125b, 126b of the spacer 124A, 124B is not flush with the sidewall 115 of the gate electrode 114. However, the disclosure is not limited thereto. In some alternative embodiments, the spacer 124A, 124B is partially overlapped with the gate electrode 114 or not overlapped with the gate electrode 114. In such embodiments, at least one of the sidewalls 125a, 125b of the spacer 124A is not overlapped with the gate electrode 114, and similarly, at least one of the sidewalls 126a, 126b of the spacer 124B is not overlapped with the gate electrode 114.

Figure 1E:
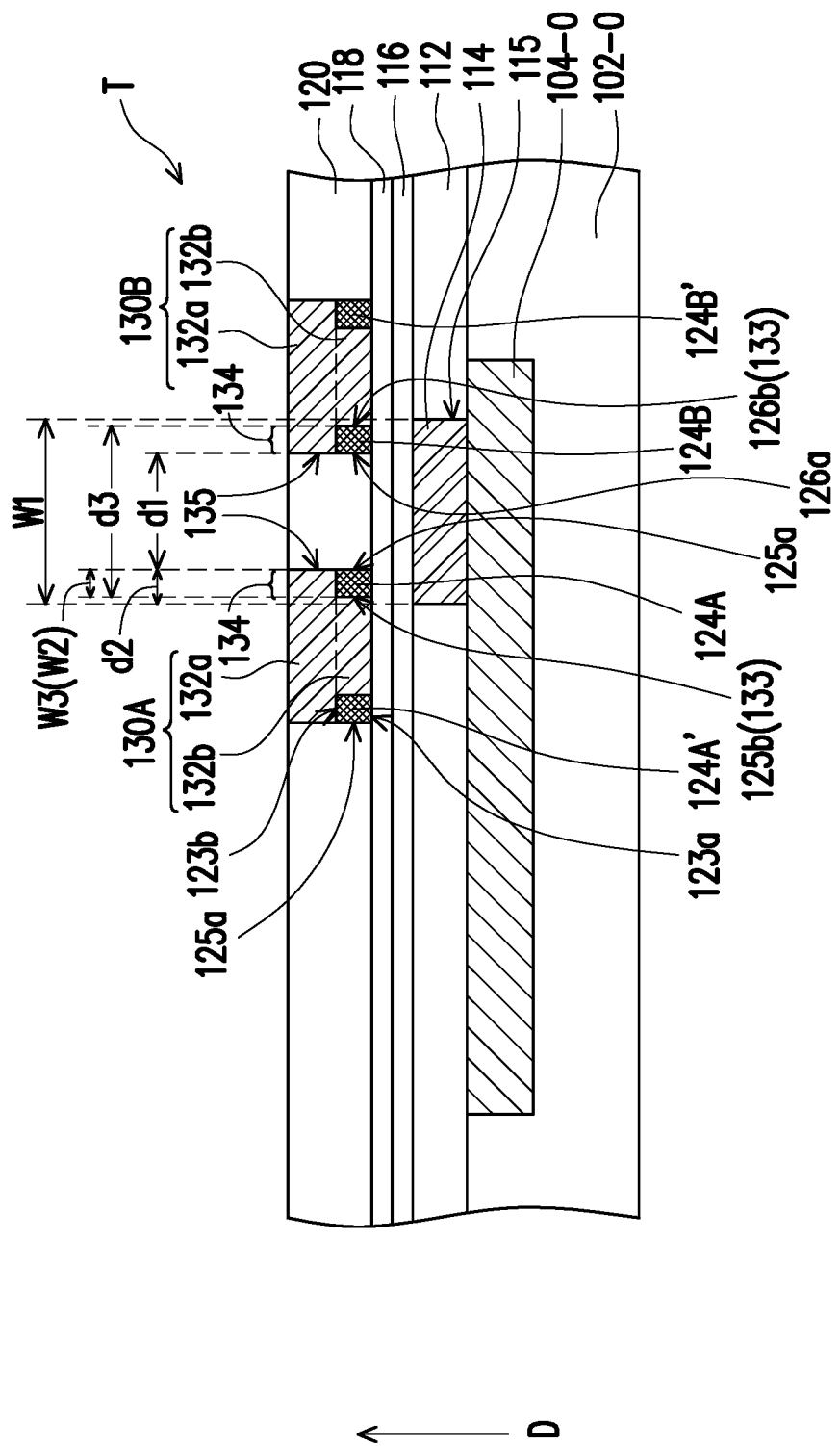

Referring to FIG. 1E, source/drain regions 130A, 130B are formed in the openings 120A, 120B respectively. The source/drain regions 130A, 130B are formed on the channel layer 118 at opposite sides of the gate electrode 114. In some embodiments, a material of the source/drain regions 130A, 130B includes cobalt, tungsten, copper, titanium, tantalum, aluminum, zirconium, hafnium, a combination thereof, or other suitable metallic materials. In some embodiments, the source/drain regions 130A, 130B are formed through CVD, ALD, plating, or other suitable deposition techniques.

In some embodiments, the source/drain region 130A is formed between the pair of spacers 124A, 124A' and extended onto the surface 123b (e.g., a top surface) of the pair of spacers 124A, 124A'. The source/drain region 130A may be in direct contact with the sidewalls 125b of the pair of spacers 124A, 124A'. Similarly, the source/drain region 130B is formed between the pair of spacers 124B, 124B' and extended onto the surface 123b (e.g., a top surface) of the pair of spacers 124B, 124B'. The source/drain region 130B may be in direct contact with the sidewalls 126b of the pair of spacers 124A, 124A'. In some embodiments, the source/drain region 130A, 130B respectively includes a first portion 132a and a second portion 132b between the first portion 132a and the gate electrode 114. The sidewalls 125b of the spacers 124A, 124A' are disposed on and in direct contact with opposite sidewalls 133 of the second portion 132b, for example. In some embodiments, the first portion 132a is disposed on the second portion 132b and covers the spacers 124A, 124A', 124B, 124B'. The opposite sidewalls 135 of the first portion 132a of the source/drain region 130A may be substantially flush with the sidewalls 125a of the spacers 124A, 124A'. Similarly, the opposite sidewalls 135 of the first portion 132a of the source/drain region 130B may be substantially flush with the sidewalls 126a of the spacers 124B, 124B'. In some embodiments, a width of the first portion 132a is larger than a width of the second portion 132b. For example, as illustrated in FIG. 1E, the source/drain region 130A, 130B exhibits a T shape from the cross-sectional view. The width of the first portion 132a and the second portion 132b may be in a range from 20 nm to 500 nm, respectively. In some embodiments, a ratio of the width of the first portion 132a and the width W2 of the spacer 124A, 124A', 124B, 124B' is in a range of about 1 to about 1000. In some embodiments, a ratio of the height of the first portion 132a and the height H of the spacer 124A, 124A', 124B, 124B' is in a range of about 0.1 to about 50. In some embodiments, the spacers 124A, 124A', 124B, 124B' surround portions (i.e., the second portions 132b) of the source/drain regions 130A, 130B, and thus the spacers 124A, 124A', 124B, 124B' are also referred to as source/drain encapsulations.

In some embodiments, a portion 134 of the first portion 132a is extended onto the spacers 124A, 124B and overlapped with the gate electrode 114. For example, as shown in FIG. 1E, in the direction D, the portion 134 is extended onto the spacers 124A, 124B and overlapped with the gate electrode 114. In other words, in the direction D, a projection of the first portion 132a onto a bottom surface of the dielectric layer 102-0 may be overlapped with a projection of the gate electrode 114 onto the bottom surface of the dielectric layer 102-0. In some embodiments, the direction D is also referred to as the stacking direction of the gate electrode 114, the channel layer 118 and the source/drain regions 130A, 130B. The portion 134 is also referred to as an extended portion or an overlapped portion. In some embodiments, the portion 134 overlapped with the gate electrode 114 has a width W3 substantially equal to the width W2 of the spacer 124A, 124A', 124B, 124B'. In some embodiments, the sidewall 135 of the portion 134 is substantially flush with the sidewall 125a, 126a of the spacer 124A, 124B. In some embodiments, the portion 134 of the source/drain region 130A, 130B is entirely overlapped with the gate electrode 114. In some embodiments, by forming the spacer 124A, 124B, the source/drain regions 130A, 130B also extend towards to each other, and the distance d1 between the source/drain regions 130A, 130B is reduced, for example.

In some embodiments, after forming the source/drain regions 130A, 130B, a transistor T is formed. In some embodiments where the gate dielectric layer 116 is a ferroelectric layer, the transistor T is a ferroelectric field-effect transistor (FeFET). In some embodiments, by forming the spacers 124A, 124B, the source/drain regions 130A, 130B further extend towards each other to overlap with the gate electrode 114 therebeneath. In this manner, a more uniform electric field (E-field) may be created across the gate dielectric layer 116 and the channel layer 118 between the gate electrode 114 and the source/drain region 130A, 130B (e.g., the portion 134 of the source/drain region 130A, 130B), respectively. Thus, the E-field may be sufficient to achieve a coercive field (Ec) to switch the ferroelectric material in the ferroelectric layer (e.g., the gate dielectric layer 116), which results in good remanent polarization (Pr). For example, the coercive field (Ec) is formed along a desired direction such as the direction D. In other words, by forming the spacers, the control of the gate electrode on the FeFET may be improved, and thus the polarization of the ferroelectric material is enhanced. In addition, the spacers may have good water absorption capacity, and thus the gas and/or the water vapor which exists in the environment or is formed during the processing may be reduced. Accordingly, the channel layer may be prevented from being influenced by the humidity.

Figure 1F:
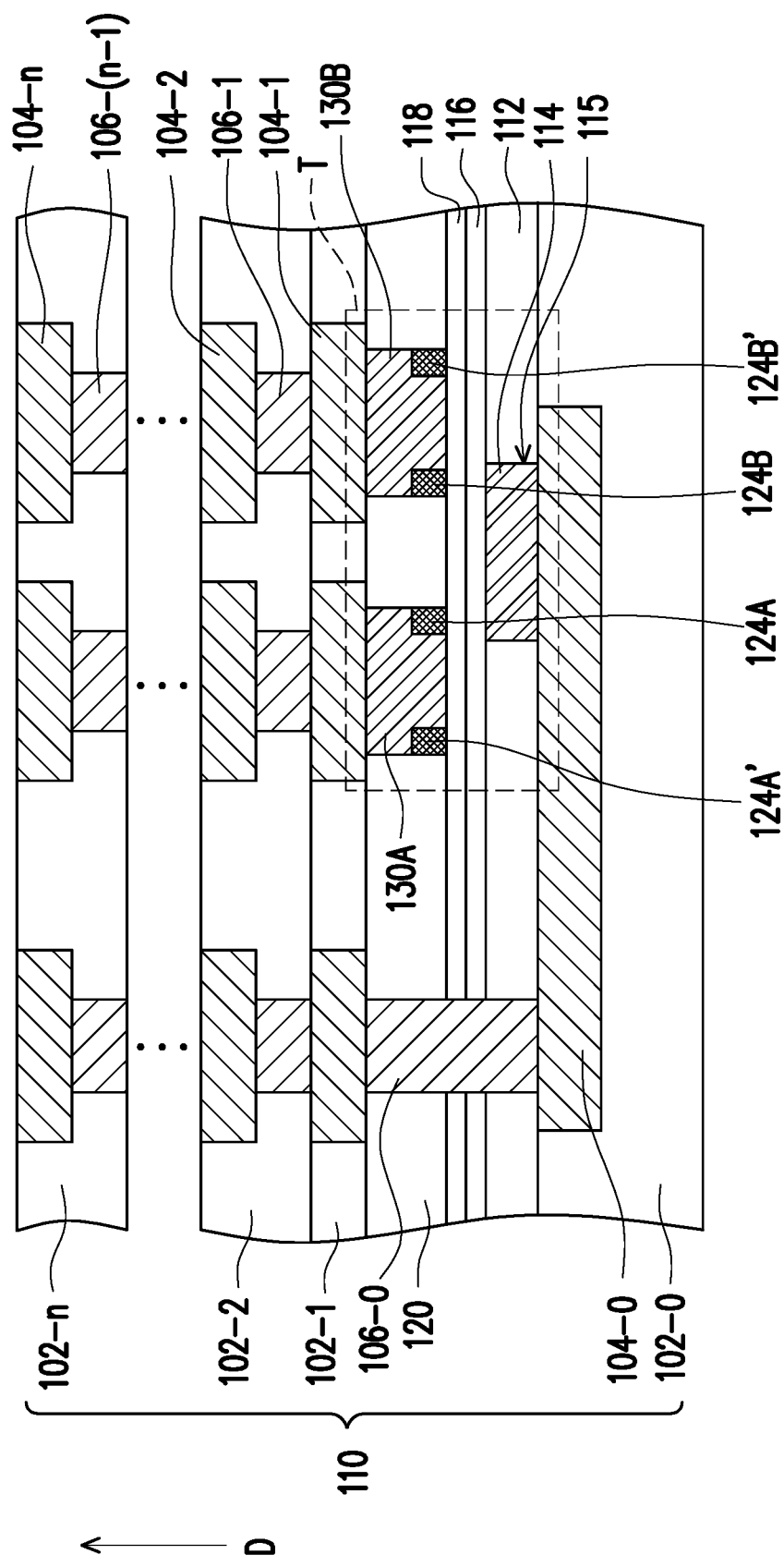
Figure 1G:
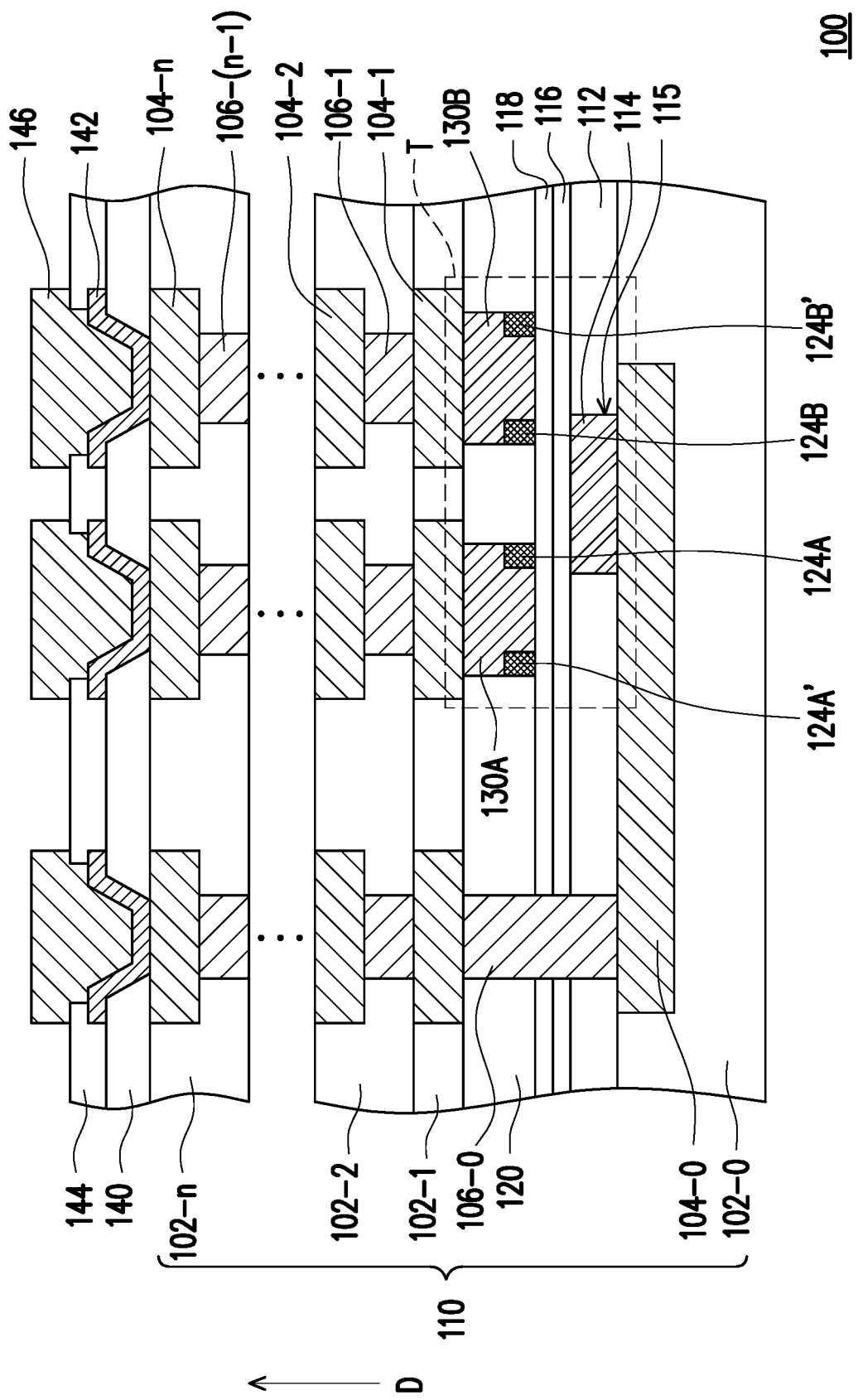

Referring to FIG. 1F, an interconnect structure 110 is formed to electrically connect the transistor T. In some embodiments, the interconnect structure 110 includes a plurality of dielectric layers 102-0, 102-1, 102-2, . . . , 102-n and a plurality of conductive features 104-0, 104-1, 104-2, . . . , 104-n, 106-0, 106-1, . . . , 106-(n−1). The dielectric layers 102-0, 102-1, 102-2, . . . , 102-n may be alternatively referred to as IMD layers. The conductive features 104-0, 104-1, 104-2, . . . , 104-n, 106-0, 106-1, . . . , 106-(n−1) may be conductive line or conductive via respectively. For example, the conductive features 104-0, 104-1, 104-2, . . . , 104-n are conductive lines, and the conductive features 106-0, 106-1, . . . , 106-(n−1) are conductive vias. In some embodiments, the conductive features 104-0, 104-1 establishes electrical connection between the transistor T and the interconnect structure 110. For example, the conductive feature 104-0 is electrically connected to the gate electrode 114, and the conductive features 104-1 are electrically connected to the source/drain regions 130A, 130B. However, the disclosure is not limited thereto. In some alternative embodiments, a conductive via is formed between the conductive feature 104-0 and the gate electrode 114 and/or between the conductive features 104-1 and the source/drain regions 130A, 130B. In addition, as mentioned above, the gate electrode 114 may be electrically connected any other suitable device.

Parts of the interconnect structure 110 may be formed before, during or after forming the transistor T. For example, the dielectric layer 102-0 and the conductive feature 104-0 are formed before forming the transistor T. In some embodiments, the conductive feature 106-0 is formed aside the transistor T. The conductive feature 106-0 is formed in the dielectric layer 112, the gate dielectric layer 116, the channel layer 118 and the dielectric layer 120, for example. The conductive feature 106-0 may be formed simultaneously with the source/drain regions 130A, 130B. For example, after forming the spacers 124A, 124A', 124B, 124B', a via opening is formed in the dielectric layer 112, the gate dielectric layer 116, the channel layer 118 and the dielectric layer 120, followed by filling the via opening and the openings 120A, 120B with a conductive material. A planarization process such as a CMP process is then performed to remove the excess portions of the conductive material higher than the top surface of the dielectric layer 120, leaving the conductive feature 106-0 in the via opening and the source/drain regions 130A, 130B in the openings 120A, 120B. In some alternative embodiments, the conductive feature 106-0 and the source/drain regions 130A, 130B are separately formed.

In some embodiments, the dielectric layers 102-1, 102-2, . . . , 102-$n$ and the conductive features 104-1, 104-2, . . . , 104-$n$, 106-1, . . . , 106-($n$–1) are formed after forming the transistor T. In some embodiments, the material and the formation of the dielectric layer 102-1, 102-2, . . . , 102-$n$ and the conductive features 104-1, 104-2, . . . , 104-$n$, 106-0, 106-1, . . . , 106-($n$–1) are similar to those of the dielectric layer 102-0 and the conductive feature 104-0, so the detailed description thereof is omitted herein. The main difference lies in the conductive features 104-2, . . . , 104-$n$, 106-1, . . . , 106-($n$–1) may be formed by a dual damascene process. For example, the conductive feature 104-2 and the underlying conductive feature 106-1 are formed simultaneously by a dual damascene process, and similarly, the conductive feature 104-$n$ and the underlying conductive feature 106-($n$–1) are formed simultaneously by a dual damascene process. However, the disclosure is not limited thereto. It should be noted that the number of the dielectric layers 102-0, 102-1, 102-2, . . . , 102-$n$ and the number of the conductive features 104-0, 104-1, 104-2, . . . , 104-$n$, 106-0, 106-1, . . . , 106-($n$–1) illustrated in FIG. 1E are merely for illustrative purposes, and the disclosure is not limited thereto. In some alternative embodiments, fewer or more layers of the dielectric layers 102-0, 102-1, 102-2, . . . , 102-$n$ and/or the number of the conductive features 104-0, 104-1, 104-2, . . . , 104-$n$, 106-0, 106-1, . . . , 106-($n$–1) may be formed depending on the circuit design.

Referring to FIG. 1G, in some embodiments, after forming the interconnect structure 110, a passivation layer 140, a plurality of conductive pads 142, a post-passivation layer 144 and a plurality of conductive terminals 146 are sequentially formed. Then, a semiconductor device 100 may be formed. In some embodiments where the transistor T is FeFET, the semiconductor device 100 is a FeFET-based device such as a FeRAM. In such embodiments, the ferroelectric layer is also referred to as a "storage layer."

In some embodiments, the passivation layer 140 is disposed on the topmost dielectric layer 102-$n$ and the topmost conductive features 104-$n$. In some embodiments, the passivation layer 140 has a plurality of openings partially exposing each topmost conductive features 104-$n$. In some embodiments, the passivation layer 140 is a silicon oxide layer, a silicon nitride layer, a silicon oxy-nitride layer, or a dielectric layer formed by other suitable dielectric materials. The passivation layer 140 may be formed by suitable fabrication techniques such as HDP-CVD, PECVD, or the like.

In some embodiments, the conductive pads 142 are formed over the passivation layer 140. In some embodiments, the conductive pads 142 extend into the openings of the passivation layer 140 to be in direct contact with the topmost conductive features 104-$n$. That is, the conductive pads 142 are electrically connected to the interconnect structure 110. In some embodiments, the conductive pads 142 include aluminum pads, copper pads, titanium pads, nickel pads, tungsten pads, or other suitable metal pads. The conductive pads 142 may be formed by, for example, electroplating, deposition, and/or photolithography and etching. It should be noted that the number and the shape of the conductive pads 142 illustrated in FIG. 1G are merely for illustrative purposes, and the disclosure is not limited thereto. In some alternative embodiments, the number and the shape of the conductive pad 142 may be adjusted based on demand.

In some embodiments, the post-passivation layer 144 is formed over the passivation layer 140 and the conductive pads 142. In some embodiments, the post-passivation layer 144 is formed on the conductive pads 142 to protect the conductive pads 142. In some embodiments, the post-passivation layer 144 has a plurality of contact openings partially exposing each conductive pad 142. The post-passivation layer 144 may be a polyimide layer, a PBO layer, or a dielectric layer formed by other suitable polymers. In some embodiments, the post-passivation layer 144 is formed by suitable fabrication techniques such as HDP-CVD, PECVD, or the like.

As illustrated in FIG. 1G, the conductive terminals 146 are formed over the post-passivation layer 144 and the conductive pads 142. In some embodiments, the conductive terminals 146 extend into the contact openings of the post-passivation layer 144 to be in direct contact with the corresponding conductive pad 142. That is, the conductive terminals 146 are electrically connected to the interconnect structure 110 through the conductive pads 142. In some embodiments, the conductive terminals 146 are conductive pillars, conductive posts, conductive balls, conductive bumps, or the like. In some embodiments, a material of the conductive terminals 146 includes a variety of metals, metal alloys, or metals and mixture of other materials. For example, the conductive terminals 146 may be made of aluminum, titanium, copper, nickel, tungsten, tin, and/or alloys thereof. The conductive terminals 146 are formed by, for example, deposition, electroplating, screen printing, or other suitable methods. In some embodiments, the conductive terminals 146 are used to establish electrical connection with other components (not shown) subsequently formed or provided.

In some embodiments, as shown in FIG. 1E, the sidewalls 125$a$, 125$b$, 126$a$, 126$b$ of the spacers 124A, 124B are all overlapped with the gate electrode 114. However, the disclosure is not limited thereto. In other words, the semiconductor device 100 may have any other suitable transistor such as transistors of FIGS. 2 to 6.

Figure 2:
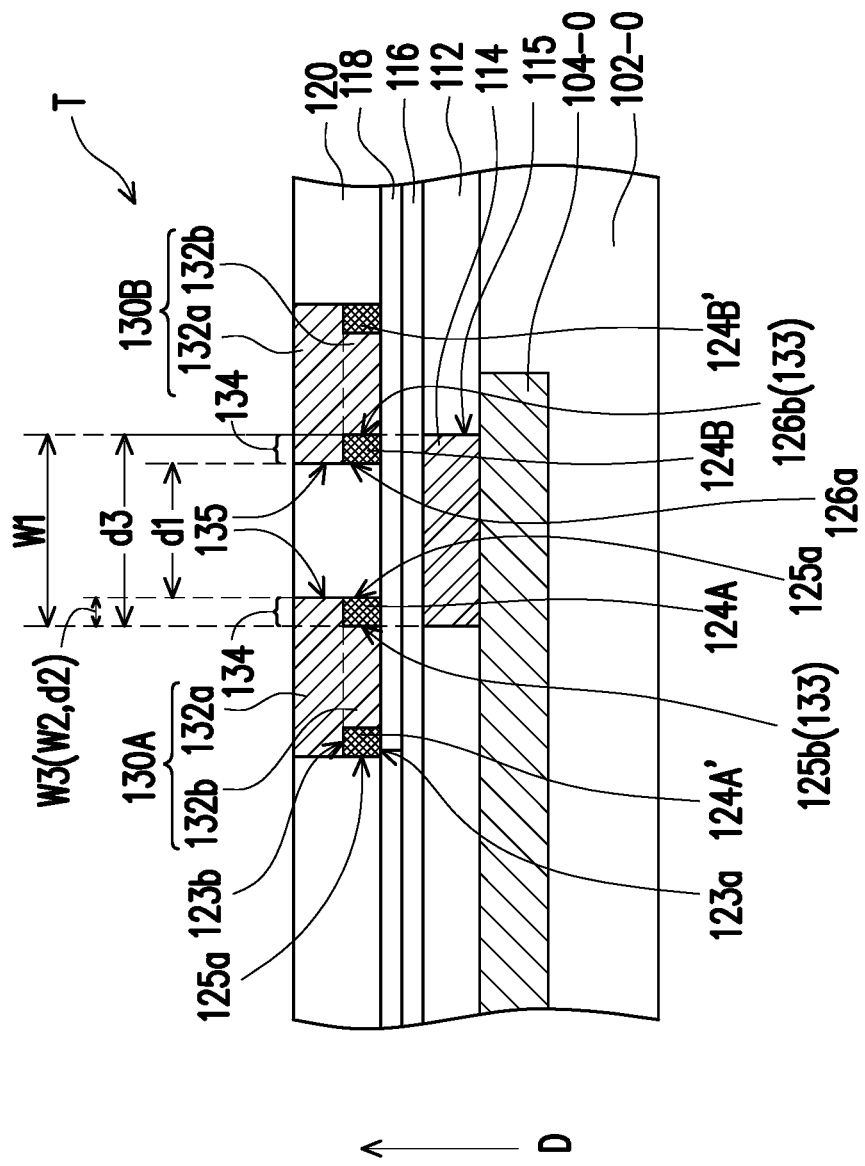
FIG. 2 is a cross-sectional view of a transistor of a semiconductor device in accordance with some alternative embodiments of the disclosure.

FIG. 2 is a cross-sectional view of a transistor of a semiconductor device in accordance with some alternative embodiments of the disclosure. Referring to FIG. 2, the transistor T in FIG. 2 is similar to the transistor T in FIG. 1E, so similar elements are denoted by the same reference numeral and the detailed description thereof is omitted herein. The main difference lies in the sidewall 125$b$, 126$b$ of the spacer 124A, 124B is flush with the sidewall 115 of the gate electrode 114 respectively, for example. In some embodiments, the distance d3 between the sidewall 125*b* of the spacer 124A, 124A' and the sidewall 126*b* of the spacer 124B, 124B' is substantially the same as the width W1 of the gate electrode 114. In such embodiments, in the direction D, the spacer 124A, 124B is entirely overlapped with the gate electrode 114, and the width W3 of the portion 134 extended on the spacer 124A, 124B and overlapped with the gate electrode 114 is substantially the same as the width W2 of the spacer 124A, 124B.

Figure 3:
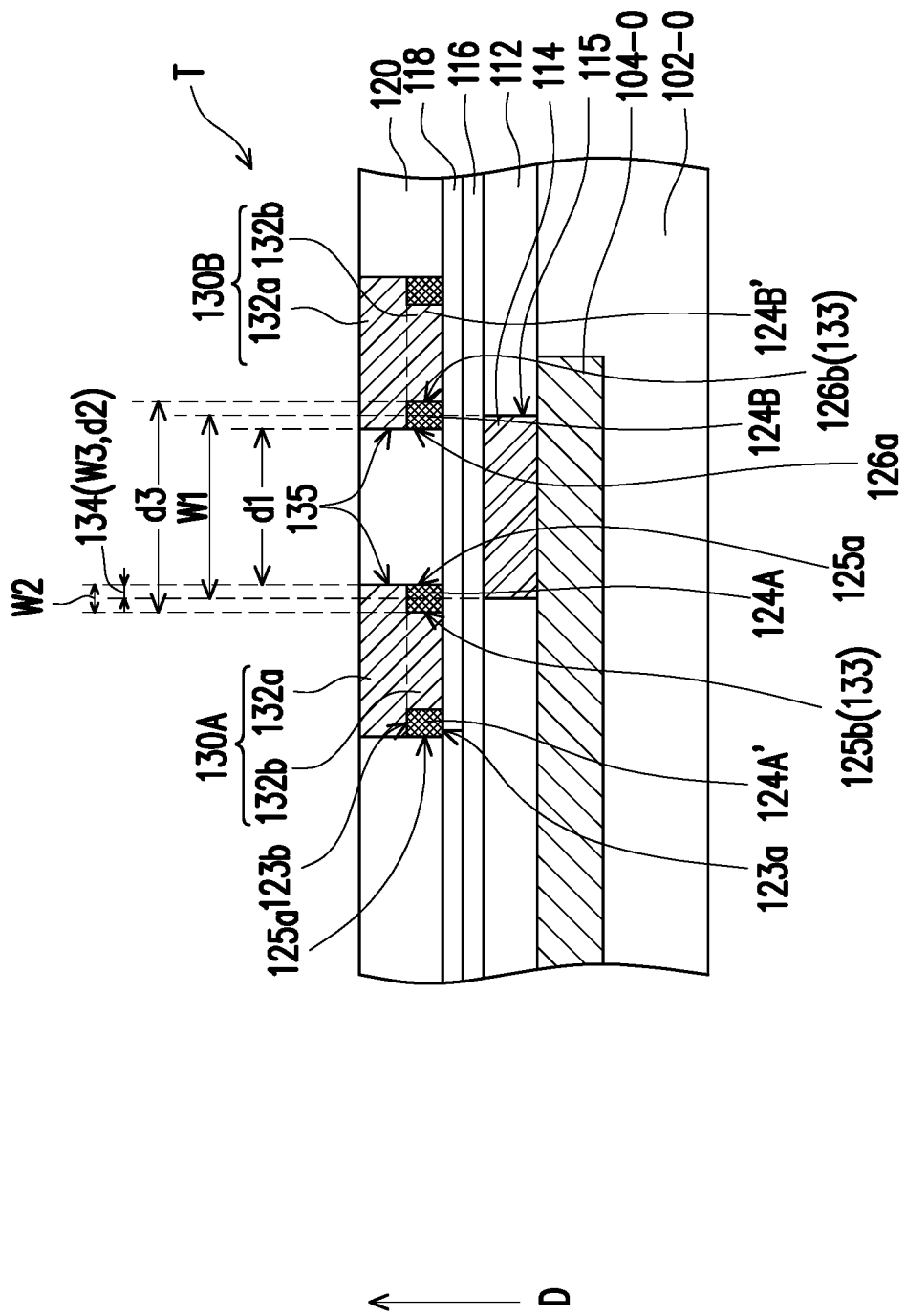
FIG. 3 is a cross-sectional view of a transistor of a semiconductor device in accordance with some alternative embodiments of the disclosure.

FIG. 3 is a cross-sectional view of a transistor of a semiconductor device in accordance with some alternative embodiments of the disclosure. Referring to FIG. 3, the transistor T in FIG. 3 is similar to the transistor T in FIG. 1E, is similar to the semiconductor device 100 in FIG. 1G, so similar elements are denoted by the same reference numeral and the detailed description thereof is omitted herein. The main difference lies in the direction D, the spacer 124A, 124B is partially (not entirely) overlapped with the gate electrode 114 therebeneath. For example, the distance d3 between the sidewall 125*b* of the spacer 124A and the sidewall 126*b* of the spacer 124B is larger than the width W1 of the gate electrode 114. Accordingly, the width W3 of the portion 134 extended on the spacer 124A, 124B and overlapped with the gate electrode 114 is smaller than the width W2 of the spacer 124A, 124B.

Figure 4:
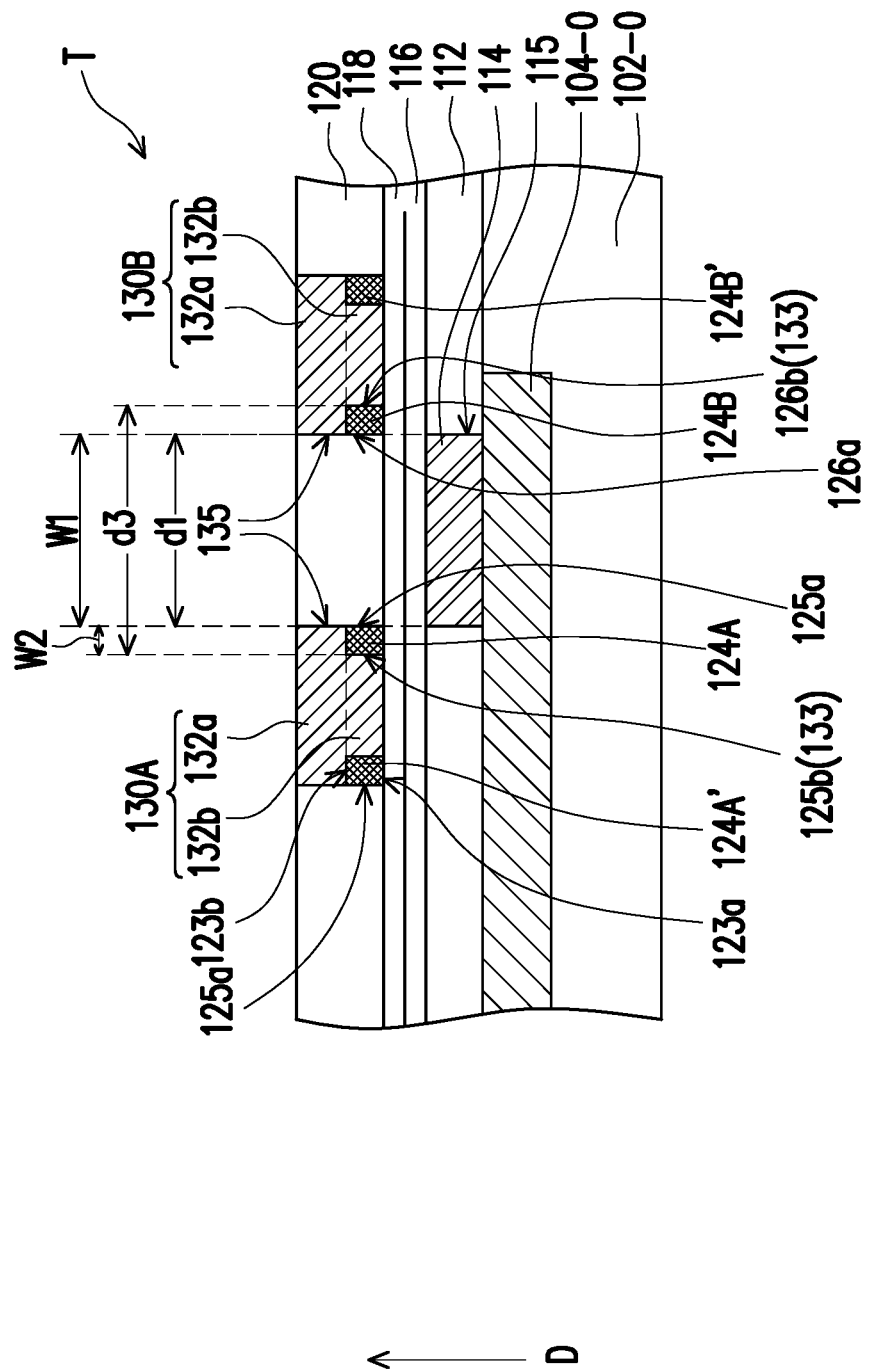
FIG. 4 is a cross-sectional view of a transistor of a semiconductor device in accordance with some alternative embodiments of the disclosure.
Figure 5:
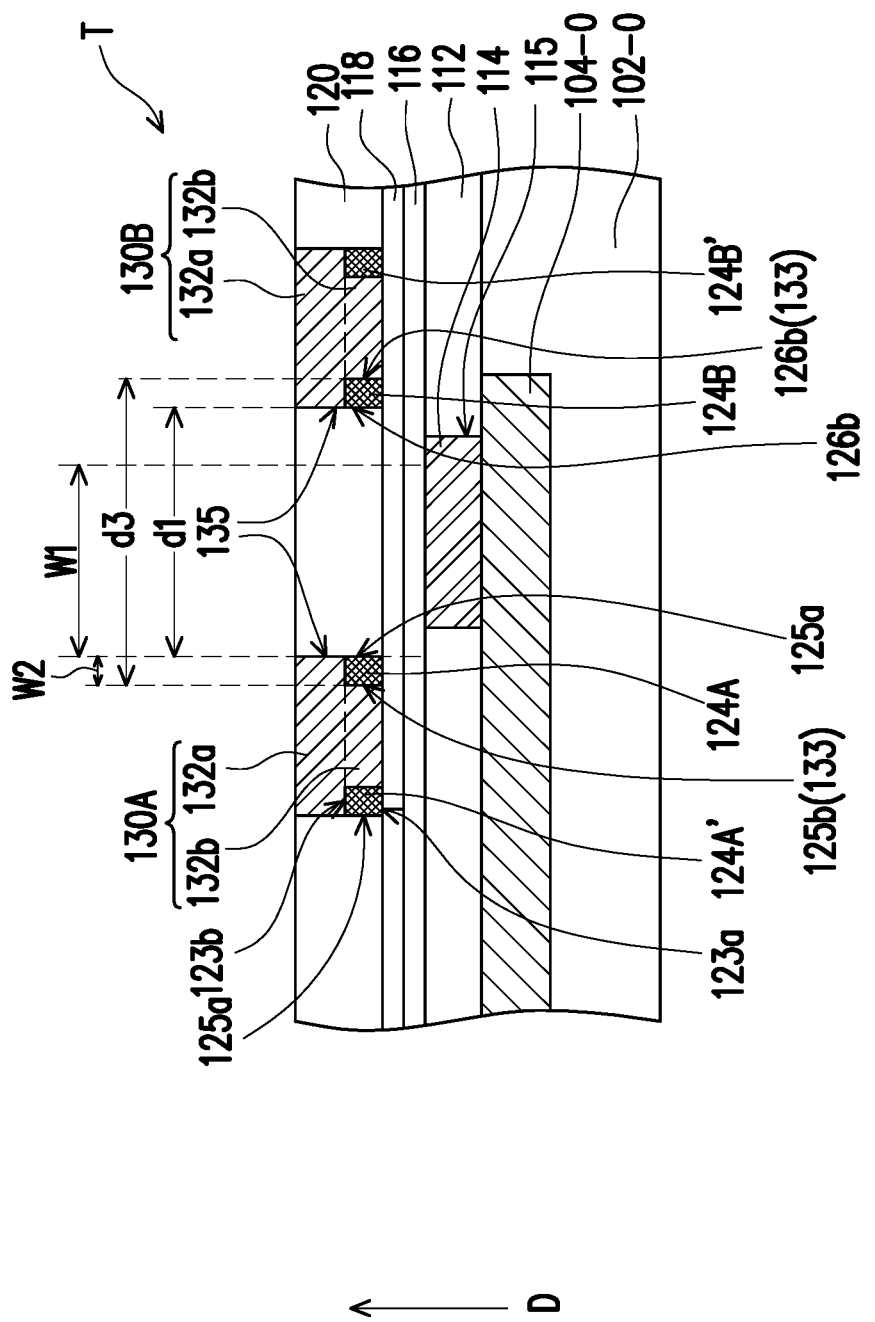
FIG. 5 is a cross-sectional view of a transistor of a semiconductor device in accordance with some alternative embodiments of the disclosure.

FIGS. 4 and 5 are respectively a cross-sectional view of a transistor of a semiconductor device in accordance with some alternative embodiments of the disclosure. Referring to FIGS. 4 and 5, the transistor T in FIGS. 4 and 5 is similar to the transistor T in FIG. 1E, so similar elements are denoted by the same reference numeral and the detailed description thereof is omitted herein. The main difference lies in the spacer 124A, 124B is not overlapped with the gate electrode 114 therebeneath. For example, the distance d1 between the sidewall 125*a* of the spacer 124A and the sidewall 126*a* of the spacer 124B is substantially the same as (as shown in FIG. 4) or larger than (as shown in FIG. 5) the width W1 of the gate electrode 114. Accordingly, the source/drain region 130A, 130B is not overlapped with the gate electrode 114 therebeneath, that is, the source/drain region 130A, 130B do not have a portion overlapped with the gate electrode 114. In such embodiments, the spacers 124A, 124A', 124B, 124B' mainly function as water absorption components.

Figure 6:
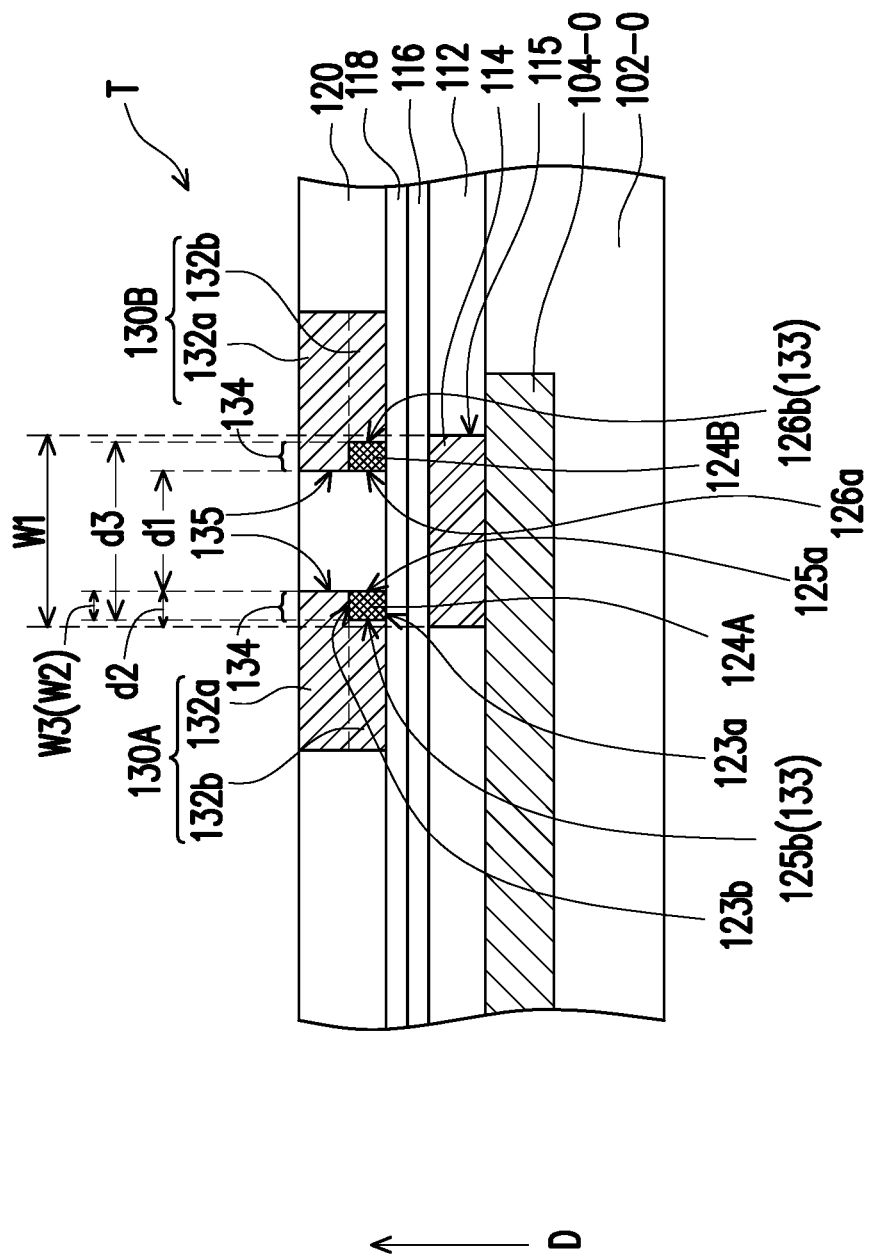
FIG. 6 is a cross-sectional view of a transistor of a semiconductor device in accordance with some alternative embodiments of the disclosure.

FIG. 6 is a cross-sectional view of a transistor of a semiconductor device in accordance with some alternative embodiments of the disclosure. Referring to FIG. 6, the transistor T in FIG. 6 is similar to the transistor T in FIG. 1E, so similar elements are denoted by the same reference numeral and the detailed description thereof is omitted herein. The main difference lies in single spacer is formed on single sidewall of the source/drain region. For example, as shown in FIG. 6, the spacer 124A is disposed on the sidewall 133 of the source/drain region 130A, and similarly, the spacer 124B is disposed on the sidewall 133 of the source/drain region 130B.

It is appreciated that although FIGS. 1E and 2 to 6 illustrate both the source/drain regions 130A, 130B have the spacer(s) on its sidewall, the disclosure is not limited thereto. In some alternative embodiments, one of the source/drain regions 130A, 130B may be formed without spacer.

Figure 7:
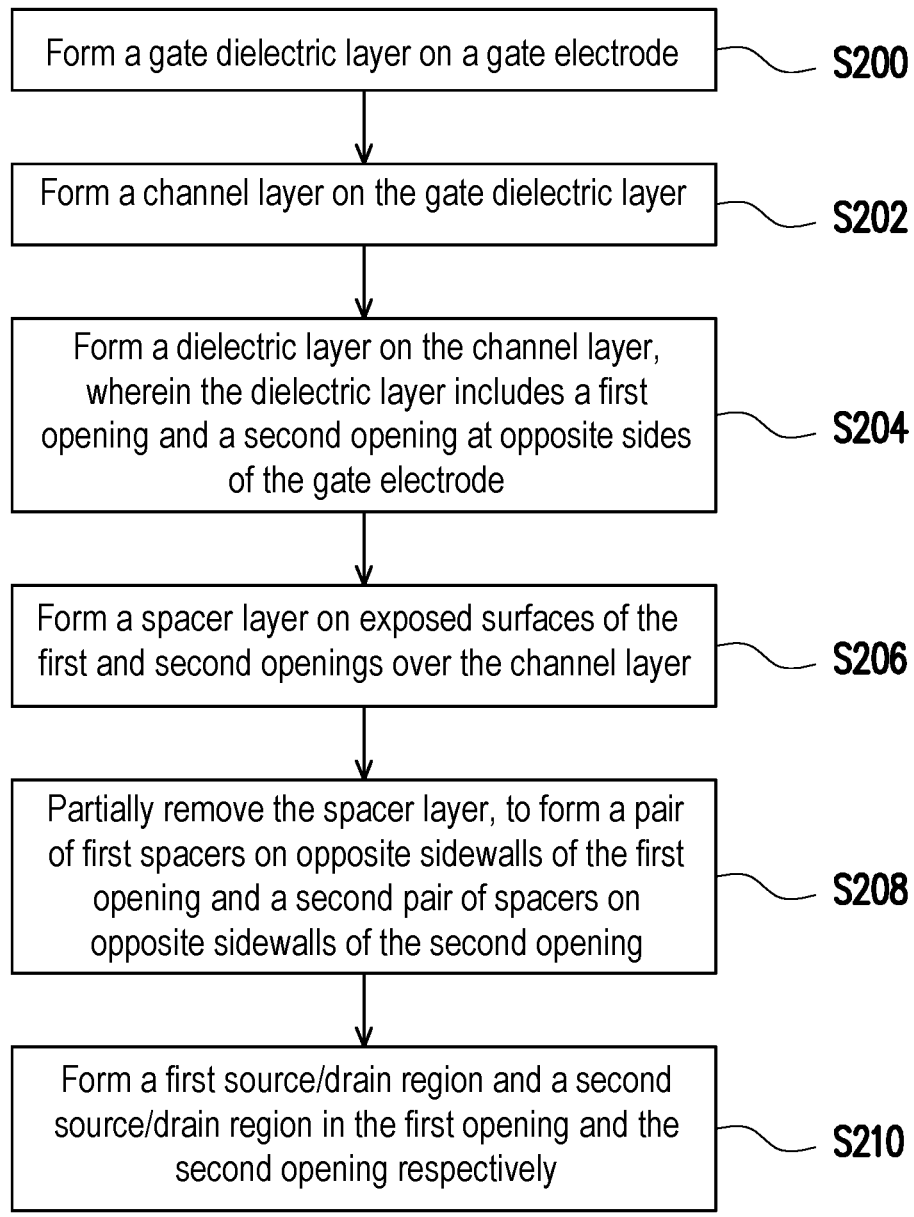
FIG. 7 illustrates a manufacturing method of a semiconductor device in accordance with some embodiments.

FIG. 7 illustrates a manufacturing method of a semiconductor device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S200, a gate dielectric layer is formed on a gate electrode. FIGS. 1A and 2-5 illustrate varying views corresponding to some embodiments of act S200.

At act S202, a channel layer is formed on the gate dielectric layer. FIGS. 1B and 2-5 illustrate varying views corresponding to some embodiments of act S202.

At act S204, a dielectric layer is formed on the channel layer, and the dielectric layer includes a first opening and a second opening at opposite sides of the gate electrode. FIGS. 1B and 2-5 illustrate varying views corresponding to some embodiments of act S204.

At act S206, a spacer layer is formed on exposed surfaces of the first and second openings over the channel layer. FIG. 1C illustrates a view corresponding to some embodiments of act S206.

At act S208, the spacer layer is partially removed, to form a pair of first spacers on opposite sidewalls of the first opening and a second pair of spacers on opposite sidewalls of the second opening. FIGS. 1D and 2-5 illustrate varying views corresponding to some embodiments of act S208.

At act S210, a first source/drain region and a second source/drain region are formed in the first opening and the second opening respectively. FIGS. 1E and 2-5 illustrate varying views corresponding to some embodiments of act S210.

In accordance with some embodiments of the disclosure, a semiconductor device includes a transistor. The transistor includes a gate electrode, a channel layer, a gate dielectric layer, a first source/drain region and a second source/drain region and a first spacer. The channel layer is disposed on the gate electrode. The gate dielectric layer is located between the channel layer and the gate electrode. The first source/drain region and the second source/drain region are disposed on the channel layer at opposite sides of the gate electrode, and at least one of the first and second source/drain regions includes a first portion and a second portion between the first portion and the gate electrode. The first spacer is disposed on the channel layer. The first spacer is disposed on a first sidewall of the second portion of the at least one of the first and second source/drain regions, and the first portion is disposed on the first spacer.

In accordance with some embodiments of the disclosure, a semiconductor device includes a ferroelectric field-effect transistor (FeFET). The FeFET includes a gate electrode, a channel layer, a ferroelectric layer, a first source/drain region and a second source/drain region and a pair of first spacers. The channel layer is disposed on the gate electrode. The ferroelectric layer is located between the channel layer and the gate electrode. The first source/drain region and the second source/drain region are disposed on the channel layer at opposite sides of the gate electrode. The pair of first spacers is disposed on the channel layer. The pair of first spacers has a first surface facing the gate electrode and a second surface opposite to the first surface. The first source/drain region is disposed between the pair of first spacers, and the first source/drain region is extended onto the second surface of the pair of first spacers to overlap with the gate electrode therebeneath.

In accordance with some embodiments of the disclosure, a manufacturing method of a semiconductor device includes following steps. A gate dielectric layer is formed on a gate electrode. A channel layer is formed on the gate dielectric layer. A dielectric layer is formed on the channel layer, and the dielectric layer includes a first opening and a second opening at opposite sides of the gate electrode. A spacer layer is formed on exposed surfaces of the first and second openings over the channel layer. The spacer layer is partially removed, to form a pair of first spacers on opposite sidewalls of the first opening and a second pair of spacers on opposite sidewalls of the second opening. A first source/drain region and a second source/drain region are formed in the first opening and the second opening respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a transistor comprising:
        a gate electrode;
        a channel layer on the gate electrode;
        a gate dielectric layer located between the channel layer and the gate electrode;
        a first source/drain region and a second source/drain region on the channel layer at opposite sides of the gate electrode, at least one of the first and second source/drain regions comprising a first portion and a second portion between the first portion and the gate electrode; and
        a first spacer on the channel layer, wherein the first portion is stacked on the gate electrode in a first direction, and the first portion is disposed on and overlapped with the first spacer in the first direction.

2. The semiconductor device of claim 1, wherein the gate electrode, the channel layer and the first and second source/drain regions are stacked in the first direction, the first portion is overlapped with the gate electrode in the first direction.

3. The semiconductor device of claim 2, wherein the first portion is entirely overlapped with the gate electrode in the first direction.

4. The semiconductor device of claim 1, wherein a first sidewall of the first spacer is in direct contact with the second portion, and a second sidewall opposite to the first sidewall of the first spacer is substantially flush with a sidewall of the first portion of the at least one of the first and second source/drain regions.

5. The semiconductor device of claim 1 further comprising a dielectric layer on the channel layer aside the first and second source/drain regions, wherein a k value of the first spacer is larger than a k value of the dielectric layer.

6. A semiconductor device, comprising:
    a ferroelectric field-effect transistor (FeFET) comprising:
        a gate electrode;
        a channel layer on the gate electrode;
        a ferroelectric layer located between the channel layer and the gate electrode;
        a first source/drain region and a second source/drain region on the channel layer at opposite sides of the gate electrode; and
        a pair of first spacers on the channel layer, wherein the first source/drain region is stacked on the gate electrode in a first direction, the first source/drain region is disposed between the pair of first spacers, and an extended portion of the first source/drain region is disposed on the pair of first spacers in the first direction.

7. The semiconductor device of claim 6, wherein the extended portion of the first source/drain region has a sidewall substantially flush with a sidewall of the pair of first spacers.

8. The semiconductor device of claim 6, wherein a sidewall of one of the pair of first spacers is substantially flush with a sidewall of the gate electrode of the first source/drain region.

9. The semiconductor device of claim 6, wherein one of the pair of first spacers is entirely overlapped with the gate electrode therebeneath.

10. The semiconductor device of claim 6 further comprising a pair of second spacers, wherein the second source/drain region is disposed between the pair of second spacers, and the second source/drain region is extended onto the pair of second spacers to overlap with the gate electrode therebeneath.

11. The semiconductor device of claim 6, wherein a distance between the first source/drain region and the second source/drain region is smaller than a width of the gate electrode.

12. The semiconductor device of claim 6, wherein the first source/drain region is in direct contact with the pair of first spacers.

13. The semiconductor device of claim 6, wherein a material of the pair of first spacers includes a high k dielectric.

14. The semiconductor device of claim 6, wherein a width of one of the pair of first spacers is in a range of 50 nm and 500 nm.

15. A manufacturing method of a semiconductor device, comprising:
    forming a gate dielectric layer on a gate electrode;
    forming a channel layer on the gate dielectric layer;
    forming a dielectric layer on the channel layer, the dielectric layer comprising a first opening and a second opening at opposite sides of the gate electrode;
    forming a spacer layer on exposed surfaces of the first and second openings over the channel layer;
    partially removing the spacer layer, to form a pair of first spacers on opposite sidewalls of the first opening and a second pair of spacers on opposite sidewalls of the second opening; and
    forming a first source/drain region and a second source/drain region in the first opening and the second opening respectively, wherein the first source/drain region is stacked on the gate electrode in a first direction, the first source/drain region is disposed between the pair of first spacers, and an extended portion of the first source/drain region is disposed on the pair of first spacers in the first direction.

16. The method of claim 15, wherein the first opening and the second opening are formed to overlap with the gate electrode therebeneath.

17. The method of claim 15, wherein partially removing the spacer layer comprises performing an anisotropic etching process without masking the spacer layer.

18. The method of claim 15, wherein forming the first source/drain region and the second source/drain region comprising:
   depositing a conductive material over the dielectric layer to fill the first opening and the second opening; and
   performing a planarization process, to remove the conductive material outside the first opening and the second opening.

19. The method of claim 15, wherein the first source/drain region and the second source/drain region are formed to cover the pair of first spacers and the second pair of spacers respectively.

20. The method of claim 15, wherein the dielectric layer is a ferroelectric layer.

* * * * *